(12) United States Patent
Merry

(10) Patent No.: US 7,550,981 B2
(45) Date of Patent: Jun. 23, 2009

(54) CIRCUIT AND METHOD FOR DETERMINING POTENTIOMETER WIPER RESISTANCE

(75) Inventor: Mark F. Merry, Tucson, AZ (US)

(73) Assignee: Honeywell International Inc., Morristown, NJ (US)

( * ) Notice: Subject to any disclaimer, the term of this patent is extended or adjusted under 35 U.S.C. 154(b) by 513 days.

(21) Appl. No.: 11/502,956

(22) Filed: Aug. 10, 2006

(65) Prior Publication Data

US 2008/0100303 A1  May 1, 2008

(51) Int. Cl.
    *G01R 27/14* (2006.01)
(52) U.S. Cl. .................. 324/714; 324/525; 73/1.88
(58) Field of Classification Search ............... 324/525, 324/714; 73/1.88
    See application file for complete search history.

(56) References Cited

U.S. PATENT DOCUMENTS

| | | | |
|---|---|---|---|
| 2,912,165 A * | 11/1959 | Poland ........................... | 702/7 |
| 3,810,008 A | 5/1974 | Motoda et al. | |
| 3,852,665 A | 12/1974 | Bothner | |
| 4,218,745 A | 8/1980 | Perkins | |
| 4,866,363 A | 9/1989 | Patton et al. | |
| 4,987,372 A | 1/1991 | Ofori-Tenkorang et al. | |
| 5,107,427 A | 4/1992 | Peter et al. | |
| 5,241,277 A | 8/1993 | Kefalas | |
| 5,289,134 A | 2/1994 | Kohr | |
| 5,542,279 A * | 8/1996 | Erdman et al. ................ | 73/1.88 |
| 5,812,411 A | 9/1998 | Calabrese et al. | |
| 6,181,141 B1 | 1/2001 | Juntunen et al. | |
| 6,184,695 B1 | 2/2001 | Glaser et al. | |
| 6,469,527 B1 | 10/2002 | Gardner | |
| 6,924,649 B2 | 8/2005 | Knoedgen | |

FOREIGN PATENT DOCUMENTS

| | | |
|---|---|---|
| DE | 3522775 | 1/1987 |
| DE | 4443941 | 6/1996 |
| EP | 0354269 | 2/1990 |
| EP | 0759558 | 2/1997 |
| EP | 1022570 | 7/2000 |
| FR | 2735871 | 12/1996 |

OTHER PUBLICATIONS

EP Search Report for Application No. 07113842.4 mailed on Nov. 30, 2007.

* cited by examiner

*Primary Examiner*—Vincent Q Nguyen
(74) *Attorney, Agent, or Firm*—Ingrassia Fisher & Lorenz, P.C.

(57) ABSTRACT

A circuit and method for determining the wiper resistance of a potentiometer that includes the step of electrically coupling a sense resistor having a substantially constant sense resistance to the potentiometer third terminal. The potentiometer is electrically energized, and a potentiometer voltage, which is a voltage potential between the potentiometer first and second terminals, is determined. The wiper position is determined based at least in part on the determined potentiometer voltage. The sense resistor is electrically coupled to a potential that causes a wiper current to flow through the wiper and sense resistor. A magnitude of the wiper current is determined, and the wiper resistance is determined based at least in part on the potentiometer resistance, the determined potentiometer position, the determined wiper current magnitude, and the sense resistance.

20 Claims, 2 Drawing Sheets

CIRCUIT AND METHOD FOR DETERMINING POTENTIOMETER WIPER RESISTANCE

TECHNICAL FIELD

The present invention relates to potentiometer characteristic measurement and, more particularly, to a circuit and method for determining the wiper resistance of a potentiometer.

BACKGROUND

A potentiometer is an electronic component that is configured to provide a user-adjustable resistance. Typically, the potentiometer is a three-terminal circuit element that includes first, second, and third terminals, a resistor electrically coupled between the first and second terminals, and a wiper electrically coupled between the resistor and the third terminal. The wiper is movable along the resistor, thereby providing a variable resistance between the wiper terminal and each of the first and second terminals.

Potentiometers are used in myriad devices and systems. For example, potentiometers are many times used to supply signals representative of the position of various components. Such components may include various types of valves, actuators, or various mechanical devices. As is generally known, the resistance of a potentiometer's terminals, as well as the resistance of the potentiometer wiper, may vary over time. These resistances may also vary with various environmental conditions to which the potentiometer may be exposed. Hence, various devices and methods have been developed to determine, in-situ, potentiometer resistances, including potentiometer wiper resistance.

Although the presently known devices and methods for determining potentiometer wiper resistance generally work well, the devices and methods can suffer certain drawbacks. For example, many devices and methods may rely on relatively complex circuitry, or relatively complex and/or expensive circuit modifications, in order to provide in-situ potentiometer wiper resistance determination. Hence, there is a need for a circuit and method of determining wiper resistance that does not rely on relatively complex circuitry, and/or relatively complex and/or expensive circuit modifications. The present invention addresses at least this need.

BRIEF SUMMARY

The present invention provides a circuit and method for determining potentiometer wiper resistance. In one embodiment, and by way of example only, a method of determining the wiper resistance of a potentiometer that includes a first terminal, a second terminal, a third terminal, a resistive element having a potentiometer resistance electrically coupled between the first and second terminals, and a wiper electrically coupled between the resistive element and the third terminal and movable to a wiper position between the first and second terminals, includes the step of electrically coupling a sense resistor having a substantially constant sense resistance to the potentiometer third terminal. The potentiometer is electrically energized, and a potentiometer voltage is determined. The potentiometer voltage being a voltage potential between the potentiometer first and second terminals. The wiper position is determined based at least in part on the determined potentiometer voltage. The sense resistor is electrically coupled to a potential that causes a wiper current to flow through the wiper and sense resistor. A magnitude of the wiper current is determined, and the wiper resistance is determined based at least in part on the potentiometer resistance, the determined potentiometer position, the determined wiper current magnitude, and the sense resistance.

In another exemplary embodiment, a potentiometer wiper resistance measurement circuit includes a potentiometer, a sense resistor, a power source, and an output circuit. The potentiometer includes a first terminal, a second terminal, a third terminal, a resistive element having a potentiometer resistance electrically coupled between the first and second terminals, and a wiper electrically coupled between the resistive element and the third terminal and movable to a wiper position between the first and second terminals. The sense resistor has a substantially constant sense resistance and includes a first terminal and a second terminal. The sense resistor first terminal is coupled to the potentiometer third terminal. The power source is electrically coupled to the potentiometer and is configured to supply a current thereto that results in a voltage drop between the potentiometer first and second terminals. The output circuit has a plurality of input terminals and an output terminal. Separate ones of the output circuit input terminals are coupled to at least the potentiometer first terminal, the potentiometer second terminal, and the sense resistor output terminal. The output circuit operable to selectively couple the potentiometer first terminal to the output terminal, the potentiometer third terminal to the output terminal, and the sense resistor second terminal to a reference potential.

In yet another exemplary embodiment, a potentiometer wiper resistance measurement circuit includes a potentiometer, a sense resistor, a power source, and first, second, third, and fourth multiplexers. The potentiometer includes a first terminal, a second terminal, a third terminal, a resistive element having a potentiometer resistance electrically coupled between the first and second terminals, and a wiper electrically coupled between the resistive element and the third terminal and movable to a wiper position between the first and second terminals. The sense resistor has a substantially constant sense resistance and includes a first terminal and a second terminal. The sense resistor first terminal is coupled to the potentiometer third terminal. The power source is electrically coupled to the potentiometer and is configured to supply a current thereto that results in a voltage drop between the potentiometer first and second terminals. The first multiplexer has a plurality of input terminals and an output terminal. A first of its input terminals is coupled to the potentiometer first terminal, and a second of its input terminals coupled to the potentiometer third terminal. The second multiplexer has a plurality of input terminals and an output terminal. A first of its input terminals is coupled to the sense resistor second terminal. The third multiplexer has a plurality of input terminals and an output terminal. A first of its input terminals is coupled to the reference potential, and its output terminal is coupled to the second multiplexer output terminal. The fourth multiplexer has a plurality of input terminals and an output terminal. A first of its input terminals is coupled to the first multiplexer output terminal, and a second of its input terminals is coupled to the second multiplexer output terminal.

Other independent features and advantages of the preferred circuit and method will become apparent from the following

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
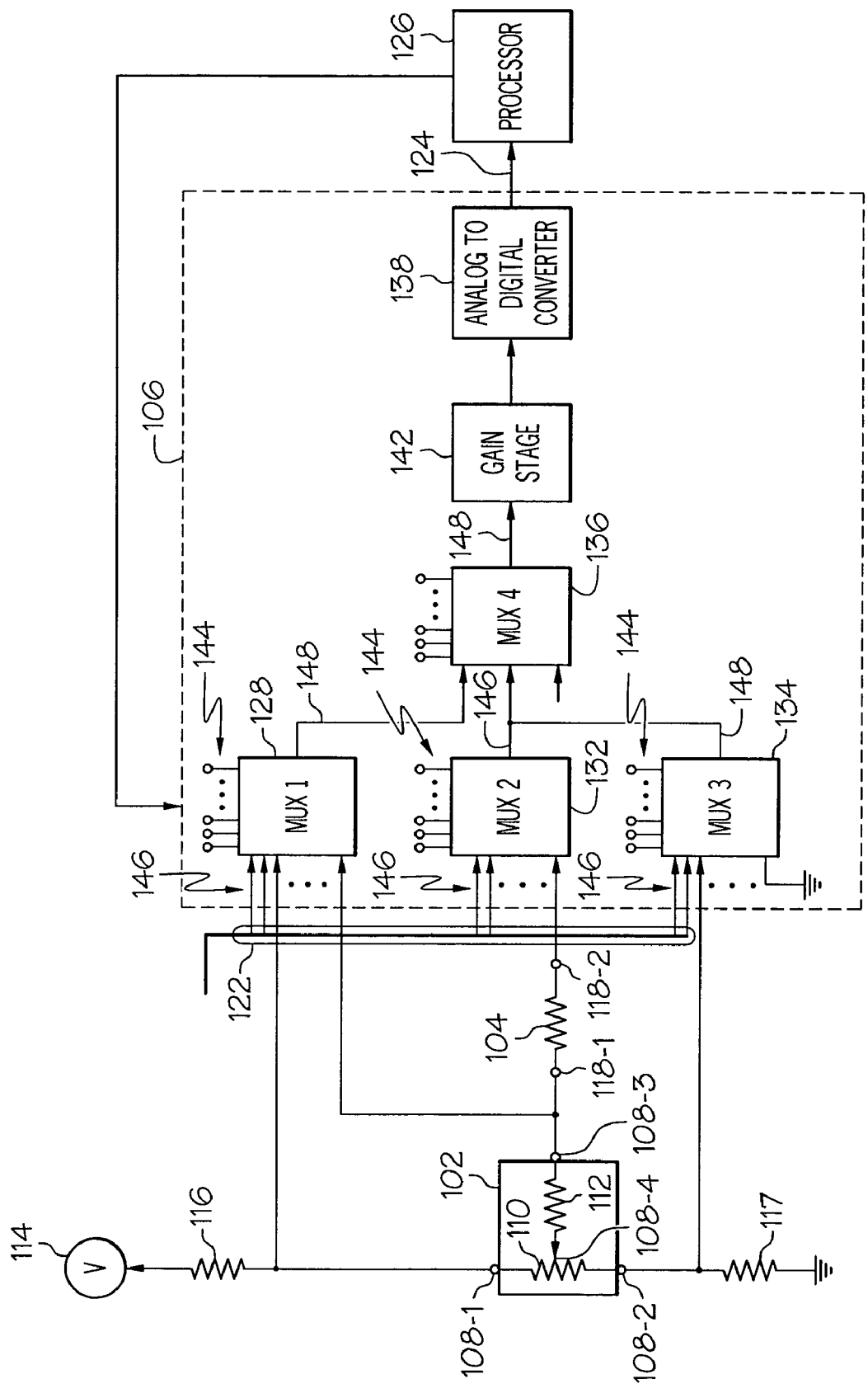
FIG. 1 depicts a functional block diagram of a potentiometer and exemplary circuit that may be used to determine the wiper resistance of the potentiometer.

Turning now to FIG. 1, a circuit 100 for determining the wiper resistance of a potentiometer is depicted. The circuit 100 includes a potentiometer 102, a sense resistor 104, and an output circuit 106. The potentiometer 102 includes a first terminal 108-1, a second terminal 108-2, a third terminal 108-3, a resistive element 110, and a wiper 112. The resistive element 110 is coupled between the first and second terminals 108-1, 108-2, and has a substantially constant resistance, which is referred to herein as the potentiometer resistance ($R_{pot}$). It will be appreciated that the resistive element 110 may be implemented using any one of numerous types of electrically resistive devices, and may additionally be implemented using one or more circuit elements.

In addition to being coupled to the resistive element 110, the first terminal 108-1 is coupled to a voltage source 114, and the second terminal 108-2 is coupled to a reference potential, such as circuit common. Thus, a current flows through the resistive element 110, generating a voltage drop across the resistive element 110. In the depicted embodiment, the first terminal 108-1 is coupled to the voltage source 114 via one or more current limiting resistors 116, and the second terminal 108-2 is coupled to the reference potential via one or more bias resistors 117. It will be appreciated that this configuration is merely exemplary, and that the potentiometer first terminal 108-1 and/or the second terminal 108-2 could instead be directly coupled to the voltage source 114 and the reference potential, respectively. In particular, it is noted that if the potentiometer resistance ($R_{pot}$) is unknown, or could vary with, for example, time and/or temperature, then the one or more current limiting resistors 116 are preferably included. If, however, the potentiometer resistance ($R_{pot}$) is known, the one or more current limiting resistors 116 could be omitted.

The wiper 112 is electrically coupled between the resistive element 110 and the third terminal 108-3, and is movable to a position between the first and second terminals 108-1, 108-2. The resistance between the third terminal 108-3 and each of the first and second terminals 108-1, 108-2 varies based on the position of the wiper 112. Hence, the voltage potential at the third terminal 108-3 similarly varies based on the position of the wiper 112. It may be appreciated that, at least in the depicted embodiment, as the wiper 112 is moved closer to the first terminal 108-1, the voltage potential at the third terminal 108-3 increases, and as the wiper 112 is moved closer to the second terminal 108-2, the voltage potential on the third terminal 108-3 decreases. As was noted above, the resistance of the wiper ($R_w$) may vary over time. As such, the wiper 112 is depicted in FIG. 1 using the schematic symbol for a resistor.

The sense resistor 104 has a first terminal 118-1, which is electrically coupled to the potentiometer third terminal 108-3, and a second terminal 118-2, which is electrically coupled to the output circuit 106. The sense resistor 104 may be implemented using one or more resistors, or various other resistive circuit elements. Moreover, the sense resistor 104 preferably has at least a substantially constant electrical resistance, which is referred to herein as the sense resistance ($R_{sense}$).

The output circuit 106 has a plurality of input terminals 122, and an output terminal 124. In the depicted embodiment, three of the input terminals 122 are coupled to the potentiometer 102, one of the input terminals 122 is coupled to the sense resistor second terminal 118-2, one of the input terminals 122 is coupled to the reference potential, and one or more of the remaining input terminals 122 are coupled to receive various signals from one or more non-illustrated circuits. In particular, one of the input terminals 122 is coupled to the potentiometer first terminal 108-1, another input terminal 122 is coupled to the potentiometer second terminal 108-2, and yet another of the input terminals 122 is coupled to the potentiometer third terminal 108-3. It will be appreciated that in an alternative embodiment, in which the potentiometer second terminal 108-2 is directly coupled to the reference potential, the input terminal 122 that is coupled to the potentiometer second terminal 108-2 can be omitted.

In addition to the above, the output circuit 106 also receives one or more input select commands from, for example, a processor 126. In response to the input select commands, the output circuit 106 supplies various signals to its output terminal 124 for further processing. In the depicted embodiment, the processor 126 that supplies the input select commands is also coupled to the output circuit output terminal 124. Thus, the processor 126 selectively receives the various signals supplied from to the output circuit output terminal 124 in response to the input select commands supplied to the output circuit 106 from the processor 126. In an alternative embodiment, separate processors or devices could be used to supply the input select commands and selectively receive the signals supplied from the output circuit 106.

At least some of the input select commands supplied to the output circuit 106 are used to electrically couple selected ones of the potentiometer terminals 108 to the output circuit output terminal 124, and the sense resistor second terminal 118-2 to the output circuit output terminal 124 and/or to the reference potential. In doing so, the signals at these terminals, which are concomitantly supplied to the output circuit output terminal 124, are used by the processor 126 to determine the potentiometer wiper resistance ($R_w$). The manner in which the potentiometer wiper resistance ($R_w$) is determined based on these signals is described below. Before doing so, however, a particular physical implementation of the output circuit 106, which is also depicted in more detail in FIG. 1, will first be described.

In the depicted implementation, the output circuit includes four multiplexers—a first multiplexer 128, a second multiplexer 132, a third multiplexer 134, and a fourth multiplexer 136—an analog-to-digital converter (ADC) 138, and may optionally include a gain stage 142. Each of the multiplexers 128-136 is a multi-channel multiplexer that includes a plurality of channel select input terminals 144, a plurality of input terminals 146, and an output terminal 148. It will be appreciated that the multiplexers 128-136 could be implemented using multiplexers having any one of numerous channels. In other words, each multiplexer 128-136 could be an N-channel multiplexer that includes $\log_2(N)$ channel select input terminals 144, and N-number of input terminals 146. No matter the specific number of channels each includes, the multiplexers 128-132 are each coupled to receive, via its channel select input terminals 144, selected ones of the input select commands from the processor. In response to the input select commands, the multiplexers 128-132, in a conventionally known manner, selectively enables one or more of its input terminals 146, which electrically couples the enabled input terminal 146 to its output terminal 148.

The ADC 138 is coupled to receive the analog signals supplied to the fourth multiplexer output terminal 148 and, upon receipt thereof, converts the signal, in a conventional manner, to a digital signal for use by the processor 126. The gain stage 142, if included, is disposed between the fourth multiplexer 136 and the ADC 138, and amplifies the analog signals supplied from the fourth multiplexer 136 before supplying it to the ADC 138.

Figure 2:
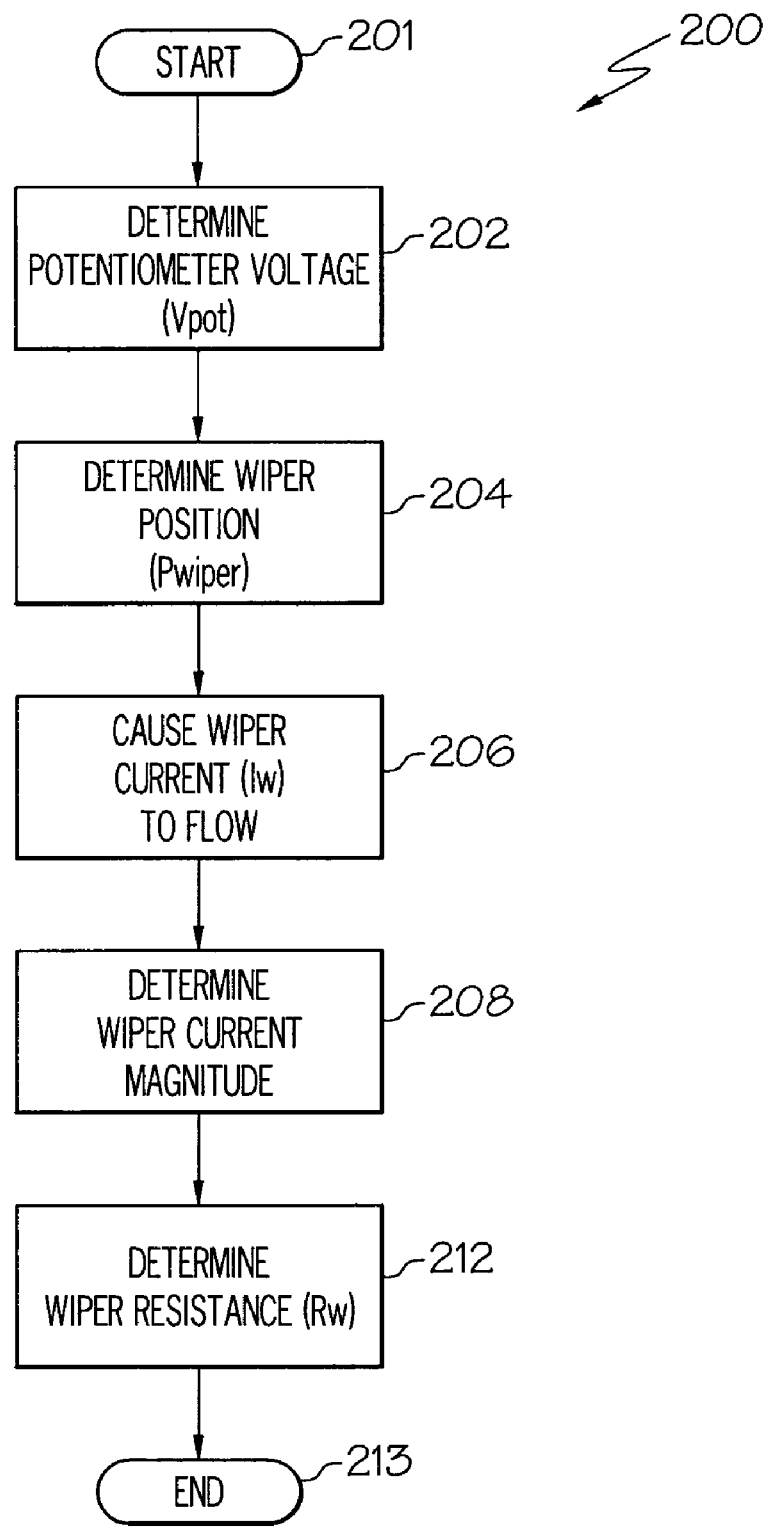
FIG. 2 depicts an exemplary process, in flowchart from, that may be implemented by the circuit of FIG. 1 for determining the potentiometer wiper resistance.

Turning now to FIG. 2, a description of the method by which above-described circuit is used to determine the potentiometer wiper resistance will be described. In accordance with the method depicted in FIG. 2, which need not be performed in depicted sequence, the potentiometer voltage ($V_{pot}$), which is defined herein as the voltage potential between the potentiometer first and second terminals, is determined (202). In accordance with the depicted embodiment, this is accomplished by enabling the input terminal 146 of the first multiplexer 128 that is coupled to the potentiometer first terminal 108-1, and the input terminal 146 of the fourth multiplexer 136 that is coupled to the first multiplexer output terminal 148 to measure the voltage potential at the potentiometer first terminal 108-1 (e.g., $V_{HIGH}$), and then enabling the input terminal 146 of the third multiplexer 134 that is coupled to the potentiometer second terminal 108-2, and the input terminal 146 of the fourth multiplexer 136 that is coupled to the third multiplexer output terminal 148 to measure the voltage potential at the potentiometer second terminal 108-2 (e.g., $V_{LOW}$). It will thus be appreciated that the potentiometer voltage ($V_{pot}$) is determined from the difference between these two voltages (e.g., $V_{pot}=V_{HIGH}-V_{LOW}$). It will additionally be appreciated that in an alternative embodiment, in which the potentiometer second terminal 108-2 is directly coupled to the reference potential, the voltage on the potentiometer first terminal 108-1 is the potentiometer voltage ($V_{pot}$). Moreover, it is noted that because the current flow through the potentiometer ($I_{pot}$) is equal to the potentiometer voltage divided by the resistance of the one or more current limiting resistors 116 (e.g., $I_{pot}=V_{pot}/R_{116}$), then, if need be, the potentiometer resistance ($V_{pot}$) can be determined from the potentiometer voltage and current (e.g. $R_{pot}=V_{pot}/I_{pot}$).

Whether or not the potentiometer resistance is known, or needs to be determined, the wiper position ($P_{wiper}$) is then determined based, at least in part, on the determined potentiometer voltage (204). Although this may be accomplished in any one of numerous ways, preferably it is done so by measuring the wiper voltage ($V_{wiper}$), and then dividing the measured wiper voltage ($V_{wiper}$) by the potentiometer voltage ($V_{pot}$) (e.g., $P_{wiper}=V_{wiper}/V_{pot}$). In the depicted embodiment, the wiper voltage ($V_{wiper}$) is measured by enabling the input terminal 146 of the second multiplexer 132 that is coupled to the sense resistor second terminal 118-2, and the input terminal 146 of the fourth multiplexer 136 that is coupled to the second multiplexer output terminal 148. It will be appreciated that the input impedance of the gain stage 142, if included, is sufficiently high that the sum of the resistance of the sense resistor 104 ($R_{sense}$) and wiper resistance ($R_w$) has an insignificant impact on the wiper voltage ($V_{wiper}$) measurement.

After the above steps are completed, the sense resistor second terminal 118-2 is coupled to the reference potential, causing a wiper current ($I_w$) to flow through the wiper 112 and the sense resistor 104 (206). The magnitude of the wiper current is then determined (208). In the depicted embodiment, the wiper current ($I_w$) is caused to flow and is measured by simultaneously enabling the input terminal 146 of the first multiplexer 128 that is coupled to the potentiometer third terminal 108-3, the input terminal 146 of the second multiplexer 132 that is coupled to the sense resistor second terminal 118-2, the input terminal 146 of the third multiplexer 134 that is coupled to the reference potential, and the input terminal 146 of the fourth multiplexer 136 that is coupled to the first multiplexer 128 output terminal 148. With this configuration, the wiper voltage ($V_{wiper}$) with current flow through the wiper 112 and sense resistor 104 is measured and supplied to the processor 126. Because the sense resistance ($R_{sense}$) is known, the wiper current ($I_w$) can be determined from the measured wiper voltage (e.g., $I_w=V_{wiper}/R_{sense}$).

The processor 126 then determines the wiper resistance ($R_w$) based, at least in part, on the potentiometer resistance ($R_{pot}$) and the sense resistance ($R_{sense}$), both of which are known, the determined potentiometer position ($P_{wiper}$), and the determined wiper current ($I_w$) (212). It will be appreciated that the processor 126 could determine the wiper resistance ($R_w$) using the known, measured, and determined quantities in accordance with any one of numerous processes, algorithms, or formulae. In a particular preferred embodiment, however, the processor 126 uses a particular formula, which will now be described in more detail.

It is generally known that the potentiometer resistance ($R_{pot}$) includes a first resistance ($R_x$) and a second resistance ($R_y$). The first resistance ($R_x$) is the resistance between the first potentiometer terminal 108-1 and the portion of the wiper 112 that contacts the potentiometer resistor 110, which is referred to herein as the wiper contact 108-4. The second resistance ($R_y$) is the resistance between the potentiometer second terminal 108-2 and the wiper contact 108-4. From this and from the above, it may thus be appreciated that the voltage at the wiper contact 108-4 ($V_{wc}$) is equal to the product of the wiper current ($I_w$) and the summation of the wiper resistance ($R_w$) and the sense resistance ($R_{sense}$) (e.g., $V_{wc}=I_w(R_w+R_{sense})$). Moreover, the second resistance (Ry) may be determined according to the following equation:

$$R_y=(R_{pot})(P_{wiper}),$$

and the first resistance ($R_x$) may be determined according to the following equation:

$$R_x=R_{pot}-R_y.$$

Thus, at this point all of the resistances in the circuit 100 are known, except for the wiper resistance ($R_w$). However, as will now be explained, this value can be determined from two separate equations for the voltage at the wiper contact 108-4 ($V_{wc}$). The first equation, which was noted above, is:

$$V_{wc}=I_w(R_w+R_{sense}),$$

and the second equation is:

$$Vwc = \frac{V_{ref}\frac{(RzRb)}{(Rz+Rb)}}{Ra + \frac{(RzRb)}{(Rz+Rb)}},$$

where the variable $R_a$ is used to represent the summation of the first resistance ($R_x$) and the resistance of the one or more current limiting resistors 116 (e.g., $R_a=R_x+R_{116}$), the variable $R_b$ is used to represent the summation of the second resistance ($R_y$) and the one or more bias resistors 117 (e.g., $R_b=R_y+R_{117}$), the variable $R_z$ is used to represent the summation of the wiper resistance and sense resistance (e.g., $R_z=R_w+R_{sense}$), $$\frac{(RzRb)}{(Rz+Rb)}$$

is the parallel resistance formed by $R_z$ and $R_b$, and $V_{ref}$ is the voltage source 114. When these two equations are equated, the following result is obtained:

$$IwRz = \frac{V_{ref}\frac{(RzRb)}{(Rz+Rb)}}{Ra + \frac{(RzRb)}{(Rz+Rb)}}.$$

The denominator on the right side of the equation may then be eliminated as follows:

$$IwRz = \frac{V_{ref}RzRb}{Ra(Rz+Rb)+(RzRb)},$$

$$IwRz(RaRz+RaRb+RzRb)=VrefRzRb.$$

Then, by canceling $R_z$ from both sides:

$$Iw(RaRz+RaRb+RzRb)=V_{ref}Rb,$$

and rearranging this equation so that $R_z$ is on the left side, the following is obtained:

$$Rz = \frac{V_{ref}Rb - IwRaRb}{Iw(Ra+Rb)}.$$

Because, as noted above, $R_z=R_w+R_{sense}$, it thus follows that:

$$R_w = \frac{V_{ref}R_b - I_w R_a R_b}{I_w R_{pot}} - R_{sense}.$$

It is noted that this is the preferred equation that the processor 126 implements to determine the wiper resistance ($R_w$) of the potentiometer 102.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A method of determining wiper resistance of a potentiometer including a first terminal, a second terminal, a third terminal, a resistive element having a potentiometer resistance electrically coupled between the first and second terminals, and a wiper electrically coupled between the resistive element and the third terminal and movable to a wiper position between the first and second terminals, the method comprising the steps of:
    electrically energizing the potentiometer;
    electrically coupling a sense resistor to the potentiometer third terminal, the sense resistor having a substantially constant sense resistance;
    determining a potentiometer voltage, the potentiometer voltage being a voltage potential between the potentiometer first and second terminals;
    determining the wiper position based at least in part on the determined potentiometer voltage;
    electrically coupling the sense resistor to a potential that causes a wiper current to flow through the wiper and sense resistor;
    determining a magnitude of the wiper current; and
    determining the wiper resistance based at least in part on the potentiometer resistance, the determined potentiometer position, the determined wiper current magnitude, and the sense resistance.

2. The method of claim 1, wherein the step of determining the wiper position comprises:
    substantially preventing current flow through the sense resistor;
    determining a no-load wiper voltage at the potentiometer third terminal; and
    calculating the wiper position by dividing the determined no-load wiper voltage by the determined potentiometer voltage.

3. The method of claim 1, wherein the step of determining the magnitude of the wiper current comprises:
    determining a wiper voltage at the potentiometer third terminal when the wiper current flows through the wiper and sense resistor; and
    calculating the wiper current magnitude from the determined wiper voltage and the sense resistance.

4. The method of claim 1, wherein the potentiometer resistance includes a first resistance between the first terminal and the wiper, and a second resistance between the second terminal and the wiper, and wherein the method further comprises:
    determining the second resistance from the potentiometer resistance and the determined wiper position; and
    determining the first resistance from the potentiometer resistance and the determined second resistance.

5. The method of claim 4, wherein the wiper resistance is determined from the potentiometer resistance, the determined first resistance, the determined second resistance, the determined wiper current magnitude, and the sense resistance.

6. The method of claim 5, further comprising:
    electrically energizing the potentiometer from a voltage source having a reference voltage magnitude, and via a current limiting resistor having a resistance value and a bias resistor having a resistance value, the current limiting resistor coupled between the voltage source and the potentiometer first terminal, the bias resistor coupled between the potentiometer second terminal and a reference potential, wherein the wiper resistance is determined in accordance with the following equation:

$$R_w = \frac{V_{ref} R_b - I_w R_a R_b}{I_w R_{pot}} - R_{sense},$$

where:
$V_{ref}$=the reference voltage magnitude,
$I_w$=the wiper current flow,
$R_a$=the first resistance plus the resistance value of the current limiting resistor,
$R_b$=the second resistance plus the resistance of the bias resistor,
$R_{pot}$=the potentiometer resistance,
$R_{sense}$=the sense resistance, and
$R_w$=the wiper resistance.

7. The method of claim 1, wherein the step of determining the potentiometer voltage comprises determining a voltage magnitude at least at the potentiometer first terminal.

8. The method of claim 7, wherein the step of determining the potentiometer voltage further comprises determining a voltage magnitude at the potentiometer second terminal.

9. The method of claim 1, further comprising:
determining the potentiometer resistance.

10. The method of claim 9, further comprising:
determining a voltage magnitude at least at the potentiometer first terminal; and
determining the potentiometer resistance based at least in part on the determined voltage magnitude at the potentiometer first terminal.

11. A potentiometer wiper resistance measurement circuit, comprising:
a potentiometer including a first terminal, a second terminal, a third terminal, a resistive element having a potentiometer resistance electrically coupled between the first and second terminals, and a wiper electrically coupled between the resistive element and the third terminal and movable to a wiper position between the first and second terminals;
a sense resistor having a substantially constant sense resistance and including a first terminal and a second terminal, the sense resistor first terminal coupled to the potentiometer third terminal;
a power source electrically coupled to the potentiometer and configured to supply a current thereto that results in a voltage drop between the potentiometer first and second terminals; and
an output circuit having a plurality of input terminals and an output terminal, separate ones of the output circuit input terminals coupled to at least the potentiometer first terminal, the potentiometer second terminal, and the sense resistor second terminal, the output circuit operable to selectively couple (i) the potentiometer first terminal to the output terminal, (ii) the potentiometer third terminal to the output terminal, and (iii) the sense resistor second terminal to a reference potential.

12. The circuit of claim 11, wherein the output circuit includes:

a first multiplexer having a plurality of input terminals and an output terminal, a first of the input terminals coupled to the potentiometer first terminal, a second of the input terminals coupled to the potentiometer third terminal;
a second multiplexer having a plurality of input terminals and an output terminal, a first of the input terminals coupled to the sense resistor second terminal;
a third multiplexer having a plurality of input terminals and an output terminal, a first of the input terminals coupled to the reference potential, the output terminal coupled to the second multiplexer output terminal; and
a fourth multiplexer having a plurality of input terminals and an output terminal, a first of the input terminals coupled to the first multiplexer output terminal, a second of the input terminals coupled to the second multiplexer output terminal.

13. The circuit of claim 12, wherein the first of the third multiplexer input terminals is further coupled to the potentiometer second terminal.

14. The circuit of claim 12, wherein a second of the third multiplexer input terminals is coupled to the potentiometer second terminal.

15. The circuit of claim 12, further comprising:
an analog-to-digital converter (ADC) coupled to the fourth multiplexer output terminal.

16. The circuit of claim 15, further comprising:
an amplifier coupled between the ADC and the fourth multiplexer output terminal.

17. The circuit of claim 11, further comprising:
a processor coupled to receive signals supplied from the output circuit output terminal and selectively operable, upon receipt thereof, to determine the potentiometer wiper resistance.

18. The circuit of claim 17, further comprising:
a processor coupled to receive signals supplied from the fourth multiplexer output terminal and selectively operable, upon receipt thereof, to determine the potentiometer wiper resistance.

19. A potentiometer wiper resistance measurement circuit, comprising:
a potentiometer including a first terminal, a second terminal, a third terminal, a resistive element having a potentiometer resistance electrically coupled between the first and second terminals, and a wiper electrically coupled between the resistive element and the third terminal and movable to a wiper position between the first and second terminals;
a sense resistor having a substantially constant sense resistance and including a first terminal and a second terminal, the sense resistor first terminal coupled to the potentiometer third terminal;
a power source electrically coupled to the potentiometer and configured to supply a current thereto that results in a voltage drop between the potentiometer first and second terminals;
a first multiplexer having a plurality of input terminals and an output terminal, a first of the input terminals coupled to the potentiometer first terminal, a second of the input terminals coupled to the potentiometer third terminal;
a second multiplexer having a plurality of input terminals and an output terminal, a first of the input terminals coupled to the sense resistor second terminal;
a third multiplexer having a plurality of input terminals and an output terminal, a first of the input terminals coupled to the reference potential, the output terminal coupled to the second multiplexer output terminal; and a fourth multiplexer having a plurality of input terminals and an output terminal, a first of the input terminals coupled to the first multiplexer output terminal, a second of the input terminals coupled to the second multiplexer output terminal.

20. The circuit of claim 19, wherein a second of the third multiplexer input terminals is coupled to the potentiometer second terminal.

* * * * *